(12) United States Patent
Strange

(10) Patent No.: US 9,760,377 B2
(45) Date of Patent: Sep. 12, 2017

(54) CIRCUIT FOR INCREASING VOLTAGE SWING OF A LOCAL OSCILLATOR WAVEFORM SIGNAL

(71) Applicant: MEDIATEK Singapore Pte. Ltd

(72) Inventor: Jonathan Richard Strange, Reigate Surrey (GB)

(73) Assignee: MediaTek Singapore Pte Ltd, Solaris (SG)

( * ) Notice: Subject to any disclaimer, the term of this patent is extended or adjusted under 35 U.S.C. 154(b) by 0 days.

(21) Appl. No.: 15/017,947

(22) Filed: Feb. 8, 2016

(65) Prior Publication Data

US 2016/0285441 A1   Sep. 29, 2016

Related U.S. Application Data

(60) Provisional application No. 62/139,714, filed on Mar. 28, 2015.

(51) Int. Cl.
| | |
|---|---|
| *H03K 17/16* | (2006.01) |
| *H02M 3/07* | (2006.01) |
| *G06F 9/38* | (2006.01) |
| *G06F 9/30* | (2006.01) |
| *G06F 9/32* | (2006.01) |
| *H03K 3/356* | (2006.01) |
| *H03K 17/687* | (2006.01) |

(52) U.S. Cl.
CPC ........ *G06F 9/3806* (2013.01); *G06F 9/30058* (2013.01); *G06F 9/325* (2013.01); *G06F 9/3818* (2013.01); *H03K 3/356182* (2013.01); *H03K 17/687* (2013.01)

(58) Field of Classification Search
CPC ............ H03K 17/687; H03K 3/356182; G06F 9/3806; G06F 9/30058; G06F 9/3818; G06F 9/325
See application file for complete search history.

(56) References Cited

U.S. PATENT DOCUMENTS

| | | | | |
|---|---|---|---|---|
| 4,970,409 | A * | 11/1990 | Wada .................... | G11C 5/145 307/110 |
| 5,594,380 | A * | 1/1997 | Nam .................... | G11C 7/1051 326/88 |
| 5,729,165 | A * | 3/1998 | Lou .................. | H03K 19/01714 326/88 |
| 6,356,137 | B1 * | 3/2002 | Roohparvar .......... | G11C 5/145 327/390 |

(Continued)

*Primary Examiner* — Kenneth B Wells
(74) *Attorney, Agent, or Firm* — Optimus Patents US, LLC

(57) ABSTRACT

A bootstrap circuit for increasing the voltage swing of a local oscillator waveform signal. The bootstrap circuit comprises a driver stage for driving at an output thereof a local oscillator waveform signal having an increased voltage swing. The driver stage comprises a first supply voltage node and a second supply voltage node. The bootstrap circuit further comprises at least one energy storage component arranged to store energy within an energy storage element when the voltage level at the input node of the driver stage comprises the second voltage state and use the energy stored within the energy storage element to generate an increased voltage level, and to apply the increased voltage level to the first supply voltage node of the driver stage when the voltage level at the input node of the driver stage comprises the first voltage state.

11 Claims, 5 Drawing Sheets

(56) References Cited

U.S. PATENT DOCUMENTS

| | | | | |
|---|---|---|---|---|
| 7,629,831 B1 * | 12/2009 | Perisetty | ............... | H02M 3/073 |
| | | | | 327/536 |
| 7,772,914 B2 * | 8/2010 | Jung | ....................... | H02M 3/07 |
| | | | | 327/390 |
| 7,969,234 B2 * | 6/2011 | Jung | ....................... | H02M 3/07 |
| | | | | 327/536 |
| 7,973,564 B1 * | 7/2011 | Chuang | ............ | H03K 17/04123 |
| | | | | 326/86 |
| 8,324,960 B2 * | 12/2012 | Huang | .................... | H02M 3/07 |
| | | | | 327/536 |

\* cited by examiner

CIRCUIT FOR INCREASING VOLTAGE SWING OF A LOCAL OSCILLATOR WAVEFORM SIGNAL

FIELD OF THE INVENTION

This invention relates to a bootstrap circuit for increasing voltage swing of a local oscillator waveform signal.

BACKGROUND OF THE INVENTION

FIG. 1 illustrates a simplified circuit diagram of a current mode (up-converting) passive mixer 100. Input signals 112, 114, 116, 118 are mixed with local oscillator waveform signals 122, 124, 126, 128, by switching devices 132, 134, 136, 138 to generate an (up-)converted signal 130 that is output through an LC network 140. The LC network illustrated in FIG. 1 comprises a resonant LC L-network consisting of a series inductor 142 and a shunt capacitor 144, that presents a low impedance relative to the baseband impedance. In particular, the LC L-network consisting of the series inductor 142 and shunt capacitor 144 can provide both a low input impedance and develop a voltage at its output (current to voltage conversion). The LC network illustrated in FIG. 1 further comprises a series capacitor 146 and shunt inductor 148 that form a high pass filter that is desirable in filtering unwanted frequency mixing products, for example those close to the input signals 112, 114, 116, 118. Furthermore, the shunt inductor 148 can be used to resonate with a capacitive input of a load circuit (not shown), such as a radio frequency (RF) amplifier.

It is well known that the performance of a passive mixer, and in particular the linearity and noise performance, is highly dependent on the local oscillator waveform signals 122, 124, 126, 128. In particular, the linearity of the passive mixer 100 of FIG. 1 is optimum when the local oscillator waveform signals 122, 124, 126, 128 have fast rise and fall times, and the voltage swing $V_L$ to $V_H$ for the local oscillator waveform signals 122, 124, 126, 128 is maximized.

Fast rise and fall times are a function of the process technology and device size, and modern CMOS (complementary metal oxide semiconductor) processes are capable of producing very fast rise and fall times. However achieving a large (maximized) voltage swing can be problematic. Using standard CMOS circuits, the voltage swing range ($V_L$ to $V_H$) is typically set by the supply voltages ($V_{DD}$, $V_{SS}$) of the local oscillator circuits. For power consumption reasons, it is desirable to keep the supply voltage as low as practically possible, for example as determined by the local oscillator noise requirements. However, there is a clear conflict between such low power consumption considerations and the need to maximize the voltage swing of the local oscillator waveform signals 122, 124, 126, 128.

One known solution to this conflict is to introduce a voltage level shift between the last local oscillator circuit stage and the driver circuit for the mixer devices to increase the voltage swing of the local oscillator waveform signals 122, 124, 126, 128. FIG. 2 illustrates a first conventional local oscillator waveform signal voltage shift circuit 200. A first problem with the use of such a voltage shift circuit 200 is that it requires differential input signals 210, 220, which have to be generated in the preceding stage (not shown) of the local oscillator circuit, increasing power consumption and adding complexity to the local oscillator circuit. A second problem with the use of such a voltage shift circuit 200 is that a second, higher voltage supply $VDD_{HIGH}$ is required, which can complicate the overall system design.

FIG. 3 illustrates an alternative conventional voltage shift circuit 300. Advantageously, the voltage shift circuit 300 illustrated in FIG. 3 is able to operate with a single ended input signal 310 and relies on AC (alternating current) coupling and a self-biased CMOS inverter. However, a problem with the voltage shift circuit 300 illustrated in FIG. 3 is that it can suffer from poor noise performance, depending on the input voltage swing and thus on how hard the gates of the transistors 320, 330 are driven. A further problem with the voltage shift circuit 300 illustrated in FIG. 3 is that it also requires a second, higher voltage supply $VDD_{HIGH}$.

SUMMARY OF THE INVENTION

According to a first aspect of the present invention, there is provided a bootstrap circuit for increasing a voltage swing of a local oscillator waveform signal. The bootstrap circuit comprises a driver stage comprising an input node arranged to receive a waveform signal, an output node, a first supply voltage node, a voltage level at the first supply voltage node driving a voltage level at the output node of the driver stage when a voltage level at the input node comprises a first voltage state, and a second supply voltage node, a voltage level at the second supply voltage node driving a voltage level at the output node of the driver stage when the voltage level at the input node comprises a second voltage state. The bootstrap circuit further comprises at least one energy storage component arranged to:

- store energy within an energy storage element when the voltage level at the input node of the driver stage comprises the second voltage state; and
- use the energy stored within the energy storage element to generate an increased voltage level, and to apply the increased voltage level to the first supply voltage node of the driver stage when the voltage level at the input node of the driver stage comprises the first voltage state.

In this manner, the voltage swing of the local oscillator waveform signal is able to be increased beyond the principal voltage supply range.

In one optional embodiment, the at least one energy storage component may comprise a switching element operably coupled between the first supply voltage node and a first voltage supply, and controllable via a control signal to selectively couple the first supply voltage node to the first voltage supply; and the energy storage element is operably coupled between the first supply voltage node and the control signal.

In one optional embodiment, the switching device may be arranged to couple the first supply voltage node to the first voltage supply when the control signal comprises a low voltage level, and to decouple the first supply voltage node from the first voltage supply when the control signal comprises a high voltage signal.

In one optional embodiment, the bootstrap circuit may further comprise at least one further energy storage component arranged to:

- store energy within a further energy storage element when the voltage level at the input node of the driver stage comprises the first voltage state; and
- use the energy stored within the further energy storage element to generate a decreased voltage level, and to apply the decreased voltage level to the second supply voltage node of the driver stage when the voltage level at the input node of the driver stage comprises the second voltage state.

In one optional embodiment, the at least one further energy storage component may comprise a further switching element operably coupled between the second supply voltage node and a second voltage supply, and controllable via a further control signal to selectively couple the second supply voltage node to the second voltage supply; and the further energy storage element is operably coupled between the second supply voltage node and the further control signal.

In one optional embodiment, the further switching device may be arranged to couple the second supply voltage node to the second voltage supply when the further control signal comprises a high voltage level, and to decouple the second supply voltage node from the second voltage supply when the further control signal comprises a low voltage signal.

In one optional embodiment, the bootstrap circuit may further comprise a first inverter circuit arranged to receive at an input thereof an oscillator waveform signal for which a voltage swing is to be increased, and to output as the or each control signal an inverted waveform signal.

In one optional embodiment, the bootstrap circuit may further comprise a further inverter circuit arranged to receive the inverted waveform signal output by the first inverter circuit, and to output a twice inverted waveform signal provided to the input node of the driver stage.

In one optional embodiment, the or each energy storage element may comprise a capacitive element.

In one optional embodiment, the driver stage may comprise an inverter circuit.

In accordance with a second aspect of the present invention, there is provided a mixer circuit comprising a local oscillator component arranged to output a waveform signal to a mixer component. The local oscillator component comprises a local oscillator circuit arranged to generate a local oscillator waveform signal. The local oscillator component further comprises a bootstrap circuit for increasing a voltage swing of the waveform signal output by the local oscillator component. The bootstrap circuit comprises a driver stage comprising an input node arranged to receive the local oscillator waveform signal generated by the local oscillator circuit, an output node arranged to output an increased voltage swing waveform signal to the mixer component, a first supply voltage node, a voltage level at the first supply voltage node driving a voltage level at the output node of the driver stage when a voltage level at the input node comprises a first voltage state, and a second supply voltage node, a voltage level at the second supply voltage node driving a voltage level at the output node of the driver stage when the voltage level at the input node comprises a second voltage state. The bootstrap circuit further comprises at least one energy storage component arranged to:

store energy within an energy storage element when the voltage level at the input node of the driver stage comprises the second voltage state; and use the energy stored within the energy storage element to generate an increased voltage level, and to apply the increased voltage level to the first supply voltage node of the driver stage when the voltage level at the input node of the driver stage comprises the first voltage state.

In accordance with a third aspect of the present invention, there is provided a method of increasing a voltage swing of a local oscillator waveform signal. The method comprises, within a driver stage of a bootstrap circuit:

receiving a waveform signal at an input node of the driver stage;

storing energy within an energy storage element when a voltage level at the input node comprises a second voltage state, whereby a voltage level at a second supply voltage node drives a voltage level at an output node of the driver stage when the voltage level at the input node comprises the second voltage state; and using the energy stored within the energy storage element to generate an increased voltage level, and applying the increased voltage level to a first supply voltage node of the driver stage when the voltage level at the input node of the driver stage comprises a first voltage state, whereby a voltage level at the first supply voltage node drives a voltage level at the output node of the driver stage when a voltage level at the input node comprises a first voltage state.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION OF THE PREFERRED EMBODIMENTS

Example embodiments of the present invention will now be described with reference to the accompanying drawings, in which there are illustrated examples of bootstrap circuits for boosting the voltage swing of local oscillator waveform signals provided to driver circuits of passive mixer devices. However, it will be appreciated that the present invention is not limited to the specific examples herein described and as illustrated in the accompanying drawings, and various alterations and modifications may be made to the illustrated examples without departing from the scope of the present invention.

Furthermore, because the illustrated embodiments of the present invention may for the most part, be implemented using electronic components and circuits known to those skilled in the art, details will not be explained in any greater extent than that considered necessary as illustrated below, for the understanding and appreciation of the underlying concepts of the present invention and in order not to obfuscate or distract from the teachings of the present invention.

As described above, conventional approaches to introducing a voltage level shift between the last local oscillator circuit stage and the driver circuit for a mixer device to 'boost' the voltage swing of the local oscillator waveform signal suffer from a number of problems, including the need for a second, higher voltage supply $VDD_{HIGH}$. In order to avoid the need for such a second, higher voltage supply $VDD_{HIGH}$, it is proposed to use an energy storage technique to derive voltages outside of the principle supply voltage range ($V_{SS}$ to $V_{DD}$) for increasing the voltage swing of the local oscillator waveform signals beyond the principal voltage supply range.

Figure 4:
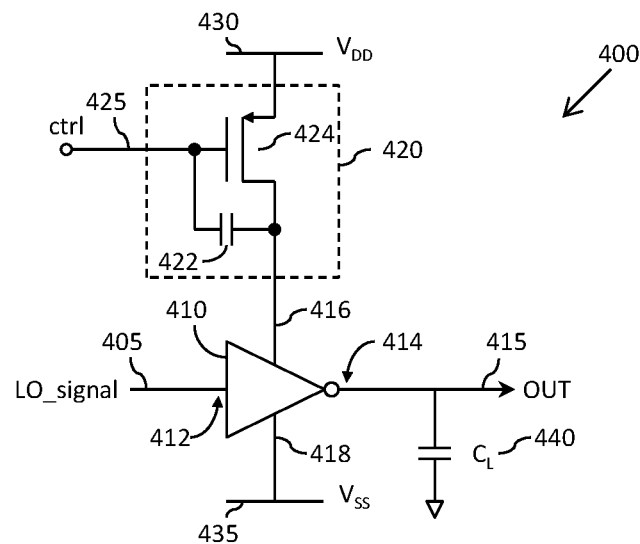
FIG. 4 illustrates a simplified circuit diagram of an example of a bootstrap circuit.

FIG. 4 illustrates a simplified circuit diagram of an example of a bootstrap circuit 400 in which such an energy storage technique is used to generate a voltage swing of a local oscillator waveform signal that extends beyond the principal voltage supply range defined by the voltage supplies $V_{DD}$ 430 and $V_{SS}$ 435. The bootstrap circuit 400 comprises a driver stage 410 arranged to receive a local oscillator waveform signal 405 at an input 412 thereof, and to drive an increased voltage swing waveform signal 415 at an output 414 thereof in response to the received local oscillator waveform signal 405 received at its input 412. In the example illustrated in FIG. 4, the driver stage 410 comprises an inverter circuit, however it will be appreciated that the present invention is not limited to the driver stage 410 comprising an inverter circuit, for example the driver stage may alternatively comprise a (non-inverting) buffer circuit. As such, the driver stage 410 is arranged to drive an increased voltage swing waveform signal 415 at the output 414 thereof inversely representative of the received local oscillator waveform signal 405 received at its input 412.

The driver stage 410 further comprises a first supply voltage node 416 and a second supply voltage node 418. As is well known in the art, a voltage level at the first supply voltage node 416 of the driver stage 410 drives a voltage level at the output node 414 of the driver stage 410 when a voltage level at the input node 412 comprises a first voltage state (a low voltage state, e.g. $<(V_{DD}-V_{SS})/2$, typically $V_{SS}$, in the case of the inverter of FIG. 4). Conversely, a voltage level at the second supply voltage node 418 of the driver stage 410 drives a voltage level at the output node 414 of the driver stage 410 when a voltage level at the input node 412 comprises a second voltage state (a high voltage state, e.g. $>(V_{DD}-V_{SS})/2$, typically $V_{DD}$, in the case of the inverter of FIG. 4).

The voltage swing for the local oscillator waveform signal 405 is typically defined by the principal voltage supply range ($V_{SS}$ to $V_{DD}$). The voltage swing for the waveform signal 415 generated by the driver stage 410 will be defined by the voltages at the supply voltage nodes 416 and 418 of the driver stage 410. More specifically, the upper limit of the voltage swing for the waveform signal 415 will be defined by the voltage level at the first voltage supply node 416 of the driver stage 410 during high output voltage periods, and the lower limit of the voltage swing for the waveform signal 415 will be defined by the voltage level at the second voltage supply node 418 of the driver stage during low output voltage periods.

In order to increase the voltage swing of the waveform signal 415 beyond the principal voltage supply range ($V_{SS}$ to $V_{DD}$), without the need for an additional, higher voltage supply, the bootstrap circuit 400 illustrated in FIG. 4 further comprises an energy storage component 420 coupled between the first supply voltage node 416 of the driver stage 410 and the first (high) voltage supply $V_{DD}$ 430. The energy storage component 420 is arranged to store energy within an energy storage element 422 when the voltage level at the input node 412 of the driver stage 410 comprises the second voltage state (a high voltage state in the case of the inverter of FIG. 4) whereby the voltage level at the output node 414 is driven by the voltage level at the second supply voltage node 418. In the illustrated example, the energy storage element 422 of the energy storage component 420 comprises a capacitive element.

The energy storage component 420 is arranged to use the energy stored within the energy storage element 422 to generate an increased voltage level ($V_{DD}+\Delta V$) relative to the first voltage supply $V_{DD}$ 430, and to apply the increased voltage level ($V_{DD}+\Delta V$) to the first supply voltage node 416 of the driver stage 410 when the voltage level at the input node 412 of the driver stage 410 comprises the first voltage state (a low voltage state in the case of the inverter of FIG. 4) such that the voltage level at the output node 414 is driven by the increased voltage level ($V_{DD}+\Delta V$) at the first supply voltage node 416. In this manner, the voltage swing for the waveform signal 415 generated by the driver stage 410 will be defined by the voltages at the supply voltage nodes 416 ($V_{DD}+\Delta V$) and 418 ($V_{SS}$) of the driver stage 410, namely $V_{SS}$ to ($V_{DD}+\Delta V$). Accordingly, for the example illustrated in FIG. 4, the voltage swing for the waveform signal 415 output by the driver stage 410 is increased by $\Delta V$ relative to the local oscillator waveform signal 405 received at the input 412 of the driver stage 410.

In the example illustrated in FIG. 4, the energy storage component 420 further comprises a switching element 424, implemented by way of a MOSFET (Metal Oxide Semiconductor Field Effect Transistor) device. The switching device 424 is operably coupled between the first supply voltage node 416 and the first voltage supply $V_{DD}$ 430, and controllable via a control signal 425 to selectively couple the first supply voltage node 416 to the first voltage supply $V_{DD}$ 430. In particular for the illustrated example, the switching device 424 is arranged to couple the first supply voltage node 416 to the first voltage supply $V_{DD}$ 430 when the control signal 425 comprises a low voltage level, and to decouple the first supply voltage node 416 from the first voltage supply $V_{DD}$ 430 when the control signal 425 comprises a high voltage signal. The energy storage element 422 is operably coupled between the first supply voltage node 416 and the control signal 425.

Accordingly, by configuring the control signal 425 to comprise a low voltage level (e.g. $V_{SS}$) when the voltage level at the input node 412 of the driver stage 410 comprises the second voltage state (a high voltage state in the case of the inverter of FIG. 4) whereby the voltage level at the output node 414 is driven by the voltage level at the second supply voltage node 418, the switching device 424 couples the first supply voltage node 416 to the first voltage supply $V_{DD}$ 430. Thus, the energy storage element 422 is coupled between the first voltage supply $V_{DD}$ 430 and the low voltage level (e.g. $V_{SS}$) of the control signal 425. As a result, the energy storage element 422 will store energy (charge) and accumulate a potential difference ($\Delta V$) thereacross of $V_{DD}-V_{SS}$ (e.g. $V_{DD}$ where $V_{SS}$ equals zero volts).

Furthermore, by subsequently configuring the control signal 425 to comprise a high voltage level (e.g. $V_{DD}$) when the voltage level at the input node 412 of the driver stage 410 comprises the first voltage state (a low voltage state in the case of the inverter of FIG. 4) whereby the voltage level at the output node 414 is driven by the voltage level at the first supply voltage node 416, the switching device 424 decouples the first supply voltage node 416 from the first voltage supply $V_{DD}$ 430. In this manner, the voltage level at the first supply voltage node 416 will be defined by the voltage level of the control signal 425 (e.g. $V_{DD}$) and the potential difference ($\Delta V$) across the energy storage element 422; thus the voltage level at the first supply voltage node 416 will be equal to $V_{DD}+\Delta V$, assuming the switching element 424 comprises an ideal switch, and the load capacitance 440 to be driven is not significant. Thus, in the case of the control signal 425 having a voltage swing of $V_{SS}$ to $V_{DD}$, the voltage level at the first supply voltage node 416 when driving the voltage at the output node 414 will be equal to $2*V_{DD}$, enabling an overall voltage swing for the waveform signal 415 at the output 414 of the driver stage 410 of $V_{SS}$ to $2*V_{DD}$ (i.e. $2*V_{DD}$ where $V_{SS}=0V$).

In reality the load capacitance 440 will be significant, and charge sharing between the capacitive energy storage element 422 and the load capacitance 440 will reduce the achievable voltage swing increase. Furthermore switching losses and the intrinsic device capacitances further reduce the achievable voltage swing. However even taking this into consideration, an output voltage swing significantly greater than $V_{DD}$ is achievable. Through appropriate selection of the value of the capacitive energy storage element 422, the level of voltage swing can be optimized.

Figure 5:
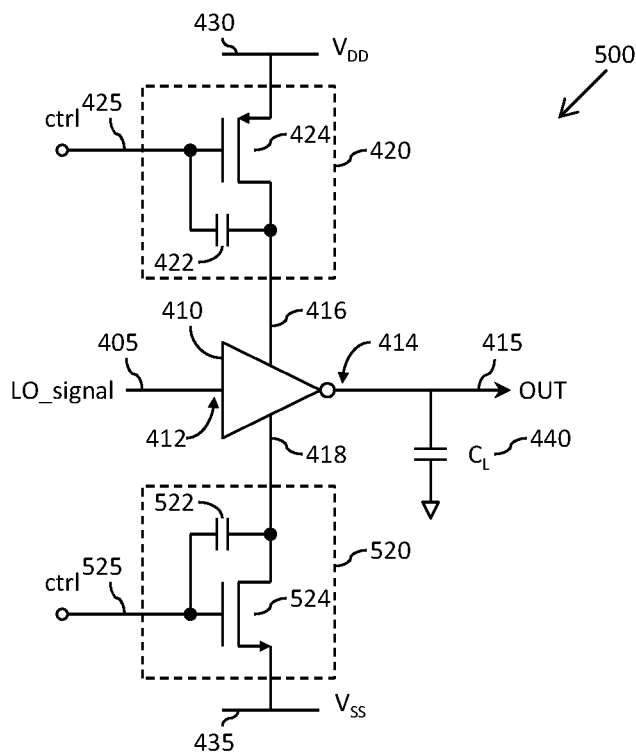
FIG. 5 illustrates a simplified circuit diagram of an alternative example of a bootstrap circuit.

Referring now to FIG. 5, there is illustrated a simplified circuit diagram of an alternative example of a bootstrap circuit 500 in which an energy storage technique is used to generate a voltage swing of a local oscillator waveform signal that extends beyond the principal voltage supply range defined by the voltage supplies $V_{DD}$ 430 and $V_{SS}$ 435. For clarity and ease of understanding, like reference numerals have been used to indicate features in common between the bootstrap circuits 400, 500 of FIGS. 4 and 5.

The bootstrap circuit 500 of FIG. 5 comprises a driver stage 410 arranged to receive a local oscillator waveform signal 405 at an input 412 thereof, and to drive an increased voltage swing waveform signal 415 at an output 414 thereof in response to the received local oscillator waveform signal 405 received at its input 412. In the example illustrated in FIG. 5, the driver stage 410 also comprises an inverter circuit. The driver stage 410 further comprises a first supply voltage node 416 and a second supply voltage node 418.

The bootstrap circuit 500 further comprises a first energy storage component 420 coupled between the first supply voltage node 416 of the driver stage 410 and the first (high) voltage supply $V_{DD}$ 430. As described above with reference to FIG. 4, the first energy storage component 420 is arranged to store energy within a first energy storage element 422 when the voltage level at the input node 412 of the driver stage 410 comprises the second voltage state (a high voltage state in the case of the inverter of FIG. 5) whereby the voltage level at the output node 414 is driven by the voltage level at the second supply voltage node 418. The first energy storage component 420 is further arranged to use the energy stored within the first energy storage element 422 to generate an increased voltage level ($V_{DD}+\Delta V_1$) relative to the first voltage supply $V_{DD}$ 430, and to apply the increased voltage level ($V_{DD}+\Delta V_1$) to the first supply voltage node 416 of the driver stage 410 when the voltage level at the input node 412 of the driver stage 410 comprises the first voltage state (a low voltage state in the case of the inverter of FIG. 5) such that the voltage level at the output node 414 is driven by the increased voltage level ($V_{DD}+\Delta V_1$) at the first supply voltage node 416.

In contrast to the bootstrap circuit 400 of FIG. 4, the bootstrap circuit 500 illustrated in FIG. 5 further comprises a second energy storage component 520 coupled between the second supply voltage node 418 of the driver stage 410 and the second (low) voltage supply $V_{SS}$ 435. The second energy storage component 520 is arranged to store energy within a second energy storage element 522 when the voltage level at the input node 412 of the driver stage 410 comprises the first voltage state (a low voltage state in the case of the inverter of FIG. 5) whereby the voltage level at the output node 414 is driven by the voltage level at the first supply voltage node 416. The second energy storage component 520 is further arranged to use the energy stored within the second energy storage element 522 to generate a decreased voltage level ($V_{SS}-\Delta V_2$) relative to the second voltage supply $V_{SS}$ 435, and to apply the decreased voltage level ($V_{SS}-\Delta V_2$) to the second supply voltage node 418 of the driver stage 410 when the voltage level at the input node 412 of the driver stage 410 comprises the second voltage state (a high voltage state in the case of the inverter of FIG. 5) such that the voltage level at the output node 414 is driven by the decreased voltage level ($V_{SS}-\Delta V_2$) at the second supply voltage node 418.

In the example illustrated in FIG. 5, the second energy storage component 520 comprises a switching element 524, implemented by way of a MOSFET device. The switching device 524 is operably coupled between the second supply voltage node 418 and the second voltage supply $V_{SS}$ 435, and controllable via a control signal 525 to selectively couple the second supply voltage node 418 to the second voltage supply $V_{SS}$ 435. In particular for the illustrated example, the switching device 524 is arranged to couple the second supply voltage node 418 to the second voltage supply $V_{SS}$ 435 when the control signal 525 comprises a high voltage level, and to decouple the second supply voltage node 418 from the second voltage supply $V_{SS}$ 435 when the control signal 525 comprises a low voltage signal. The energy storage element 522 is operably coupled between the second supply voltage node 418 and the control signal 525.

Accordingly, by configuring the control signal 525 to comprise a high voltage level (e.g. $V_{DD}$) when the voltage level at the input node 412 of the driver stage 410 comprises the first voltage state (a low voltage state in the case of the inverter of FIG. 5) whereby the voltage level at the output node 414 is driven by the voltage level at the first supply voltage node 416, the switching device 524 couples the second supply voltage node 418 to the second voltage supply $V_{SS}$ 435. Thus, the energy storage element 522 is coupled between the second voltage supply $V_{SS}$ 435 and the high voltage level (e.g. $V_{DD}$) of the control signal 525. As a result, the energy storage element 522 will store energy (charge) and accumulate a (negative) potential difference ($-\Delta V_2$) thereacross of $V_{SS}-V_{DD}$ (e.g. $-V_{DD}$ where $V_{SS}$ equals zero volts).

Furthermore, by subsequently configuring the control signal 525 to comprise a low voltage level (e.g. $V_{SS}$) when the voltage level at the input node 412 of the driver stage 410 comprises the second voltage state (a high voltage state in the case of the inverter of FIG. 5) whereby the voltage level at the output node 414 is driven by the voltage level at the second supply voltage node 418, the switching device 524 decouples the second supply voltage node 418 from the second voltage supply $V_{SS}$ 435. In this manner, the voltage level at the second supply voltage node 418 will be defined by the voltage level of the control signal 525 (e.g. $V_{SS}$) and the potential difference ($-\Delta V_2$) across the energy storage element 522; thus the voltage level at the second supply voltage node 418 will be equal to $V_{SS}-\Delta V_2$, assuming ideal conditions. Thus, in the case of the control signals 425, 525 both having a voltage swing of $V_{SS}$ to $V_{DD}$, the voltage level at the first supply voltage node 416 when driving the voltage at the output node 414 will be equal to $2*V_{DD}$, whilst the voltage level at the second supply voltage node 418 when driving the voltage at the output node 414 will be equal to $-V_{DD}$, enabling an overall voltage swing for the waveform signal 415 at the output 414 of the driver stage 410 of $-V_{DD}$ to $2*V_{DD}$ (i.e. $3*V_{DD}$).

In this manner, the voltage swing for the waveform signal 415 generated by the driver stage 410 will be defined by the voltages at the supply voltage nodes 416 ($V_{DD}+\Delta V_1$) and 418 ($V_{SS}-\Delta V_2$) of the driver stage 410, namely ($V_{SS}-\Delta V_2$) to ($V_{DD} \Delta V_1$). Accordingly, for the example illustrated in FIG. 5, the voltage swing for the waveform signal 415 output by the driver stage 410 is increased by $\Delta V_1+\Delta V_2$ (or $2*\Delta V$ where $\Delta V_1=\Delta V_2$) relative to the local oscillator waveform signal 405 received at the input 412 of the driver stage 410.

Thus, by providing energy storage components 420, 520 on each of the supply voltage nodes 416, 418, such as in the example illustrated in FIG. 5, the achievable voltage swing for the waveform signal 415 generated by the driver stage 410 may be further increased. Nevertheless, by only providing an energy storage component 420 on one of the supply voltage nodes 416, 418, such as in the example illustrated in FIG. 4, an increase of the achievable voltage swing for the waveform signal 415 generated by the driver stage 410 may still be achieved using less total capacitance for the energy storage elements, and thus with reduced size and complexity. The bootstrap circuit 400 illustrated in FIG. 4 comprises an energy storage component 420 coupled between the first supply voltage node 416 of the driver stage 410 and the first (high) voltage supply $V_{DD}$ 430. However, it will be appreciated that in alternative embodiments, a single energy storage component may alternatively be provided between the second supply voltage node 418 of the driver stage 410 and the second (low) voltage supply $V_{SS}$ 435.

Figure 6:
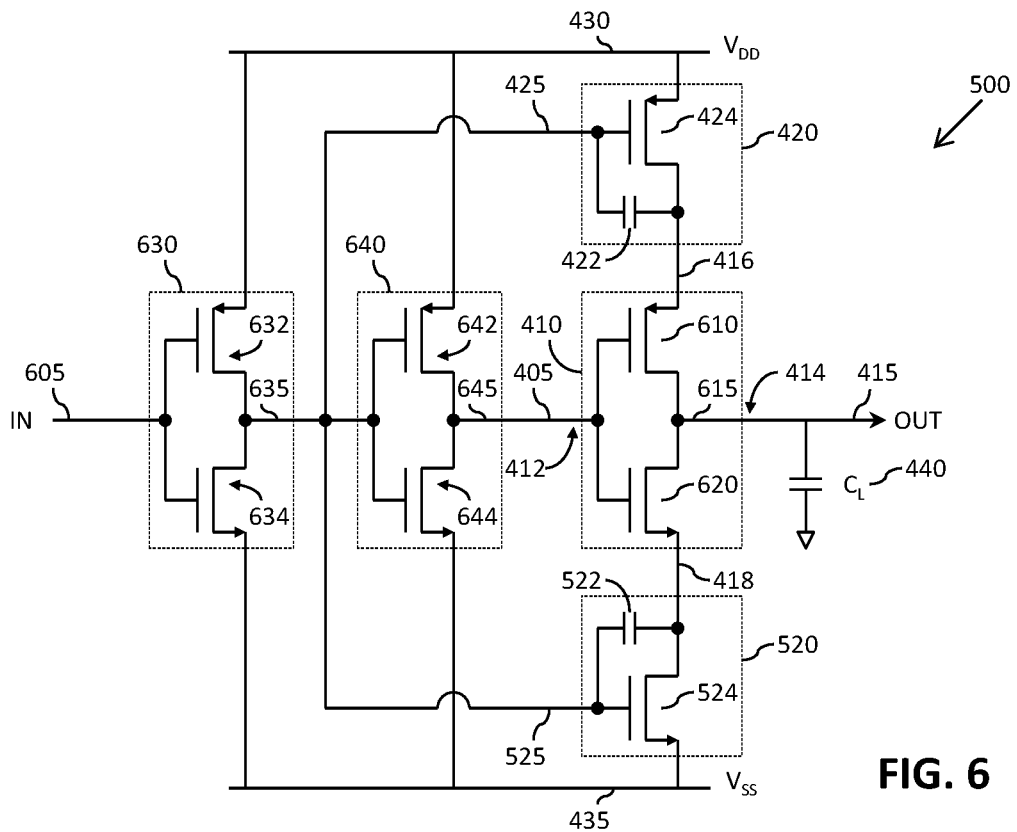
FIG. 6 illustrates a transistor level circuit diagram of an example implementation of the bootstrap circuit of FIG. 5.

Referring now to FIG. 6, there is illustrated a transistor level circuit diagram of an example implementation of the bootstrap circuit 500 of FIG. 5. The inverter circuit of the driver stage 410 consists of two CMOS transistor devices 610, 620 operably coupled in parallel between the supply voltage nodes 416, 418. The input 412 of the driver stage 410 is coupled to the gate terminals of the two CMOS transistor devices 610, 620, and a common node 615 between the two CMOS transistor devices 610, 620 provides the output 414 of the driver stage 410.

The first energy storage component 420, comprising the energy storage element 422 and switching device 424, is operably coupled between the first supply voltage node 416 and the first voltage supply 430. The second energy storage component 520, comprising the energy storage element 522 and switching device 524, is operably coupled between the second supply voltage node 418 and the second voltage supply 435.

An input stage 630 consisting of an inverter circuit is arranged to receive at an input thereof a local oscillator waveform signal 605 for which a voltage swing is to be increased, and outputs an inverted waveform signal 635. The inverter circuit of the input stage 630 consists of two CMOS transistor devices 632, 634 operably coupled in parallel between the voltage supplies 430, 435. The input of the input stage 630 is coupled to the gate terminals of the two CMOS transistor devices 632, 634, and a common node between the two CMOS transistor devices 632, 634 provides the inverted waveform signal 635. Accordingly, the inverted waveform signal 635 comprises an inverted representation of the local oscillator waveform signal 605 with a voltage shift range of $V_{SS}$ to $V_{DD}$, as defined by the voltage supplies 430, 435.

In the example illustrated in FIG. 6, the inverted waveform signal 635 output by the input stage 630 is used for the control signals 425, 525 of the energy storage components 420, 520.

In the example illustrated in FIG. 6, a middle stage 640 consisting of a further inverter circuit is arranged to receive at an input thereof the inverted waveform signal 635 output by the input stage 630, and outputs waveform signal 405 received at the input 412 of the driver stage 410. The inverter circuit of the middle stage 640 consists of two CMOS transistor devices 642, 644 operably coupled in parallel between the voltage supplies 430, 435. The input of the middle stage 640 is coupled to the gate terminals of the two CMOS transistor devices 642, 644, and a common node between the two CMOS transistor devices 642, 644 provides the waveform signal 405. Accordingly, the waveform signal 405 comprises a twice inverted (and thus non-inverted) representation of the local oscillator waveform signal 605 with a voltage shift range of $V_{SS}$ to $V_{DD}$, as defined by the voltage supplies 430, 435.

Figure 7:
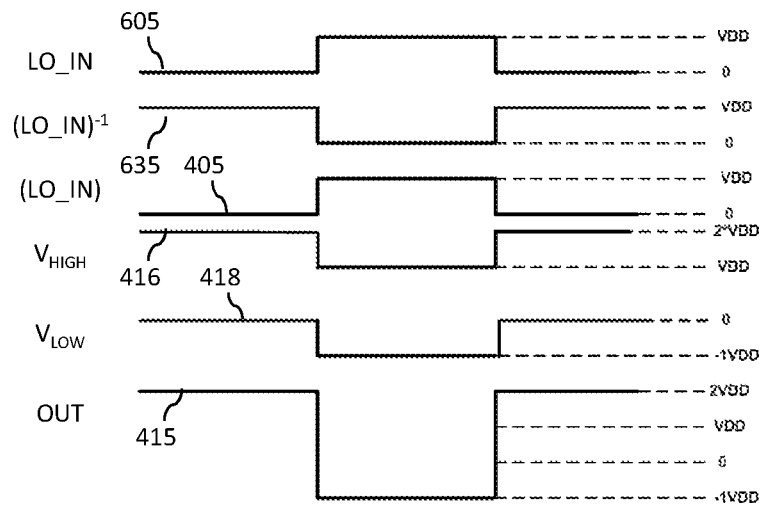
FIG. 7 illustrates a simplified voltage level timing diagram illustrating the operation of the implementation of the bootstrap circuit illustrated in FIG. 6.

FIG. 7 illustrates a simplified voltage level timing diagram illustrating the operation of the implementation of the bootstrap circuit 500 illustrated in FIG. 6.

Figure 8:
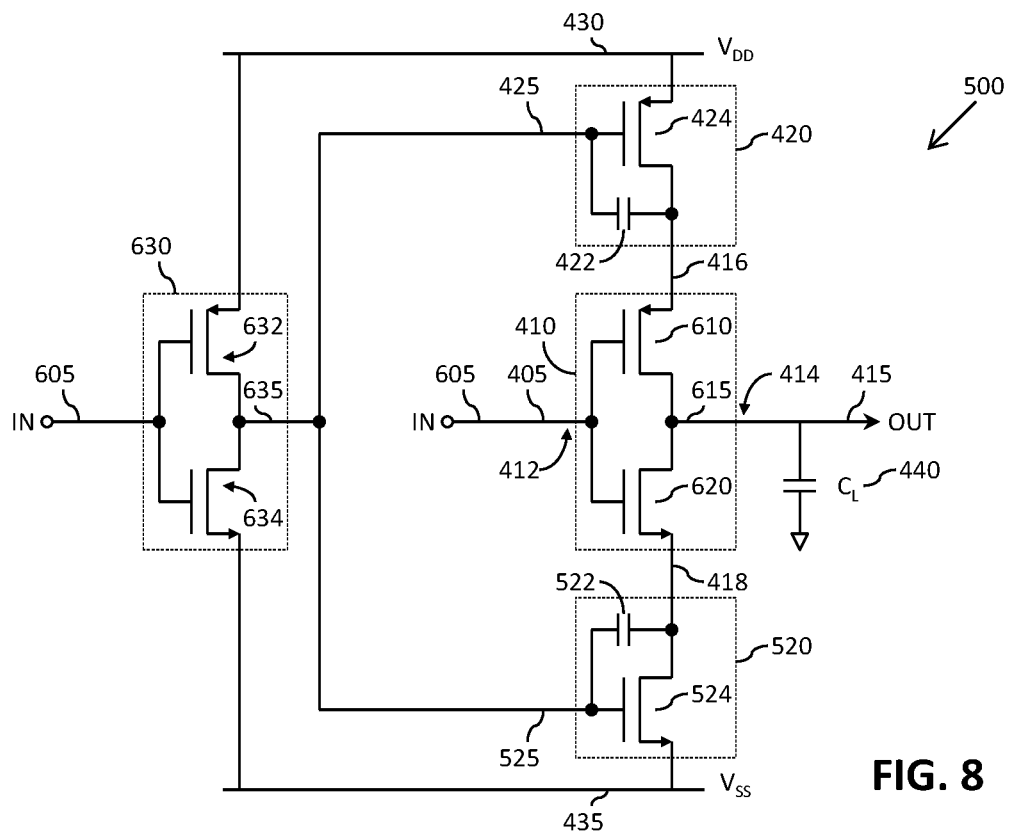
FIG. 8 illustrates a transistor level circuit diagram of an alternative example implementation of the bootstrap circuit of FIG. 5.

Referring now to FIG. 8, there is illustrated a transistor level circuit diagram of an alternative example implementation of the bootstrap circuit 500 of FIG. 5. In the example illustrated in FIG. 8, the middle stage 640 (FIG. 6) is omitted, with the local oscillator waveform signal 605 forms the waveform signal 405 received at the input 412 of the driver stage 410.

Figure 1:
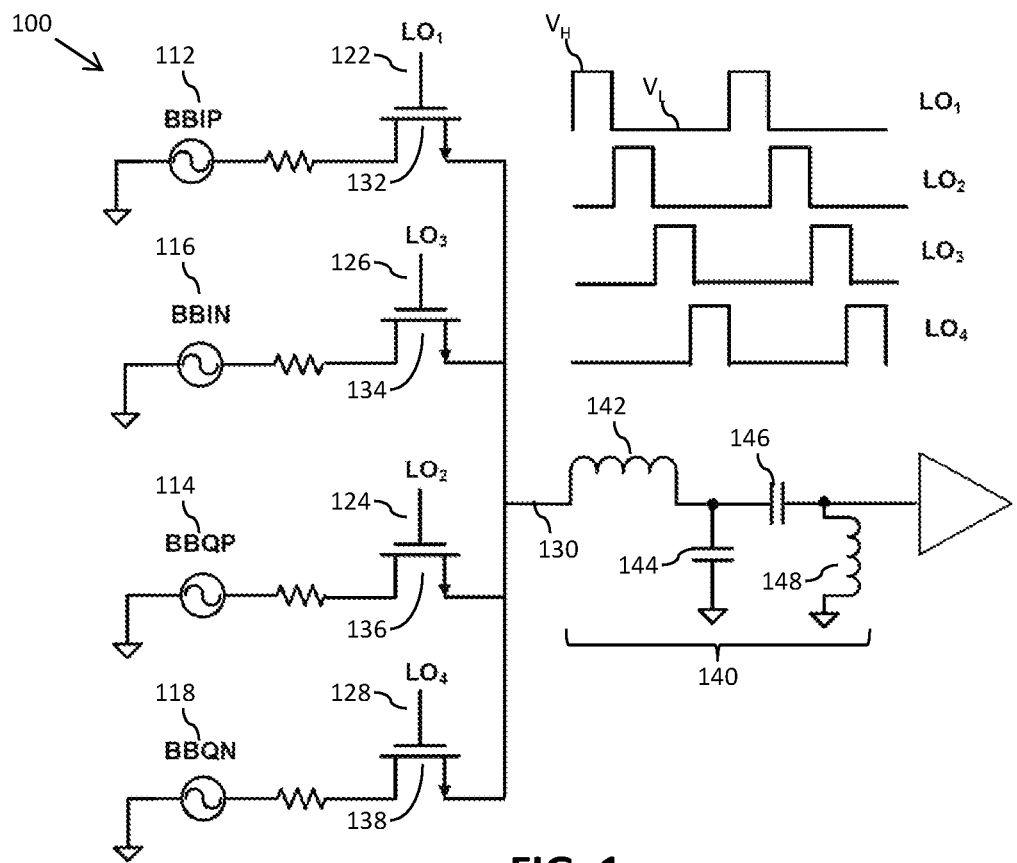
FIG. 1 illustrates a simplified circuit diagram of a current mode (up-converting) passive mixer.
Figure 2:
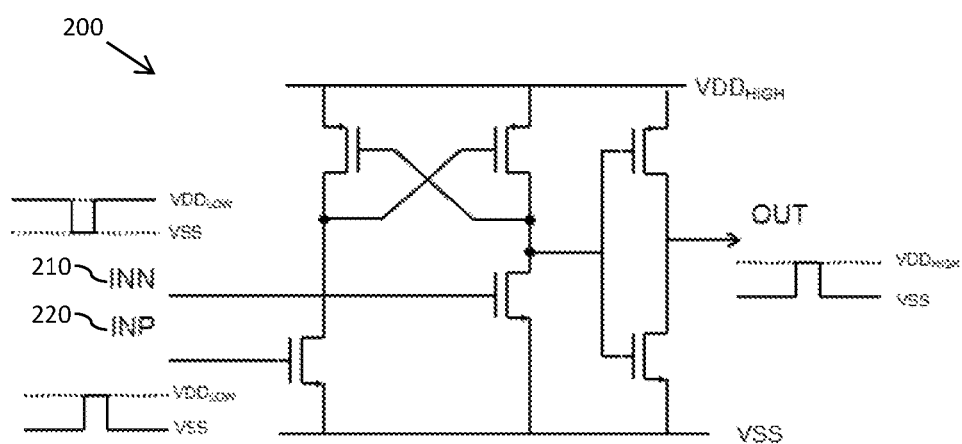
FIG. 2 illustrates a first conventional local oscillator waveform signal circuit.
Figure 3:
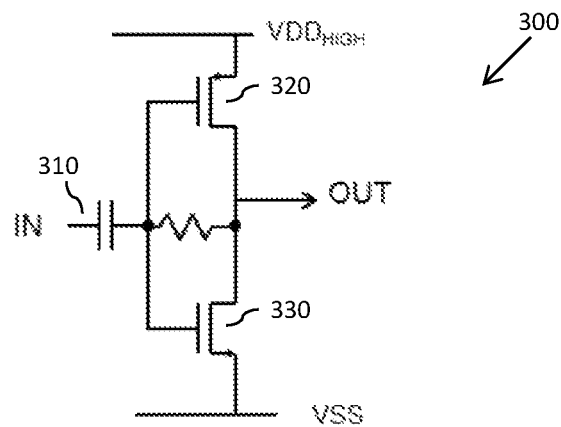
FIG. 3 illustrates an alternative conventional circuit 300.
Figure 9:
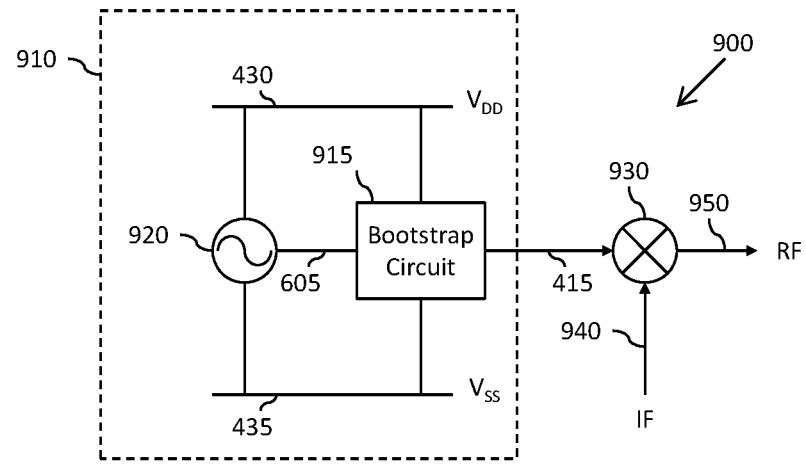
FIG. 9 illustrates a simplified block diagram of a mixer circuit.

FIG. 9 illustrates a simplified block diagram of a mixer circuit 900 comprising a local oscillator component 910 arranged to output an increased voltage swing waveform signal 415 to a mixer component 930, which in the illustrated example is arranged to mix the increased voltage swing waveform signal 415 with an intermediate frequency signal 940 to generate a radiofrequency signal 950. The mixer component 930 may comprise a passive mixer component, such as the current mode (up-converting) passive mixer 100 illustrated in FIG. 1, and in particular a 25% duty cycle passive mixer. However, will be appreciated that mixer component 930 is not limited to comprising such a 25% duty cycle current mode passive mixer, and it is contemplated that the present invention may be implemented in conjunction with other types of mixer components, such as voltage mode mixer components, etc. The local oscillator component 910 comprises a local oscillator circuit 920 arranged to generate a local oscillator waveform signal 605 for which a voltage swing is to be increased. The local oscillator component 910 further comprises a bootstrap circuit 915, such as implemented by way of one of the bootstrap circuits 400, 500 illustrated in one of FIG. 4 to 6 or 8, arranged to generate an increased voltage swing waveform signal 415 comprising a voltage swing increased beyond the principal voltage supply range ($V_{SS}$ to $V_{DD}$). As illustrated in FIG. 9, the input node of the bootstrap circuit 915 is coupled to an output of the local oscillator circuit 920 and arranged to receive the local oscillator waveform signal 605, and an output node of the bootstrap circuit 915 is coupled to the mixer component 930 and arranged to output the increased voltage swing waveform signal 415.

In the foregoing specification, the invention has been described with reference to specific examples of embodiments of the invention. It will, however, be evident that various modifications and changes may be made therein without departing from the scope of the invention as set forth in the appended claims and that the claims are not limited to the specific examples described above.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Furthermore, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms 'a' or 'an,' as used herein, are defined as one or more than one. Also, the use of introductory phrases such as 'at least one' and 'one or more' in the claims should not be construed to imply that the introduction of another claim element by the indefinite articles 'a' or 'an' limits any particular claim containing such introduced claim element to inventions containing only one such element, even when the same claim includes the introductory phrases 'one or more' or 'at least one' and indefinite articles such as 'a' or 'an.' The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

I claim:

1. A bootstrap circuit for increasing a voltage swing of a local oscillator waveform signal; the bootstrap circuit comprises a driver stage comprising:
    an input node arranged to receive a waveform signal;
    an output node;
    a first supply voltage node, a voltage level at the first supply voltage node driving a voltage level at the output node of the driver stage when a voltage level at the input node comprises a first voltage state; and
    a second supply voltage node, a voltage level at the second supply voltage node driving the voltage level at the output node of the driver stage when the voltage level at the input node comprises a second voltage state, wherein the bootstrap circuit further comprises at least one energy storage component comprising a switching element operably coupled between the first supply voltage node and a first voltage supply, and controllable via a control signal to selectively couple the first supply voltage node to the first voltage supply, and the at least one energy storage component is arranged to:
    store energy within an energy storage element when the voltage level at the input node of the driver stage comprises the second voltage state; and
    use the energy stored within the energy storage element to generate an increased voltage level, and to apply the increased voltage level to the first supply voltage node of the driver stage when the voltage level at the input node of the driver stage comprises the first voltage state;
wherein the bootstrap circuit further comprises:
    a first inverter circuit arranged to receive at an input thereof the oscillator waveform signal for which the voltage swing is to be increased, and to output as the control signal an inverted waveform signal;
    a further inverter circuit arranged to receive the inverted waveform signal output by the first inverter circuit, and to output a twice inverted waveform signal to the input node of the driver stage; and
    at least one further energy storage component arranged to:
    store energy within a further energy storage element when the voltage level at the input node of the driver stage comprises the first voltage state; and
    use the energy stored within the further energy storage element to generate a decreased voltage level, and to apply the decreased voltage level to the second supply voltage node of the driver stage when the voltage level at the input node of the driver stage comprises the second voltage state.

2. The bootstrap circuit of claim 1, wherein the switching device is arranged to couple the first supply voltage node to the first voltage supply when the control signal comprises a low voltage level, and to decouple the first supply voltage node from the first voltage supply when the control signal comprises a high voltage level.

3. The bootstrap circuit of claim 1, wherein the at least one further energy storage component comprises a further switching element operably coupled between the second supply voltage node and a second voltage supply, and controllable via a further control signal to selectively couple the second supply voltage node to the second voltage supply; and the further energy storage element is operably coupled between the second supply voltage node and the further control signal.

4. The bootstrap circuit of claim 3, wherein the further switching element is arranged to couple the second supply voltage node to the second voltage supply when the further control signal comprises the high voltage level, and to decouple the second supply voltage node from the second voltage supply when the further control signal comprises a low voltage signal.

5. The bootstrap circuit of claim 1, wherein each energy storage element comprises a capacitive element.

6. The bootstrap circuit of claim 1, wherein the driver stage comprises an inverter circuit.

7. A mixer circuit comprising a local oscillator component arranged to output a waveform signal to a mixer component, the local oscillator component comprising a local oscillator circuit arranged to generate a local oscillator waveform signal;
    wherein the local oscillator component further comprises a bootstrap circuit for increasing a voltage swing of the waveform signal output by the local oscillator component; the bootstrap circuit comprises a driver stage comprising:
an input node arranged to receive the local oscillator waveform signal generated by the local oscillator circuit;
an output node arranged to output an increased voltage swing waveform signal to the mixer component;
a first supply voltage node, a voltage level at the first supply voltage node driving a voltage level at the output node of the driver stage when a voltage level at the input node comprises a first voltage state; and
a second supply voltage node, a voltage level at the second supply voltage node driving the voltage level at the output node of the driver stage when the voltage level at the input node comprises a second voltage state,
wherein the bootstrap circuit further comprises at least one energy storage component comprising a switching element operably coupled between the first supply voltage node and a first voltage supply, and controllable via a control signal to selectively couple the first supply voltage node to the first voltage supply, and the at least one energy storage component is arranged to:
store energy within an energy storage element when the voltage level at the input node of the driver stage comprises the second voltage state; and
use the energy stored within the energy storage element to generate an increased voltage level, and to apply the increased voltage level to the first supply voltage node of the driver stage when the voltage level at the input node of the driver stage comprises the first voltage state;
wherein the bootstrap circuit further comprises:
a first inverter circuit arranged to receive at an input thereof the oscillator waveform signal for which the voltage swing is to be increased, and to output as the control signal an inverted waveform signal;
a further inverter circuit arranged to receive the inverted waveform signal output by the first inverter circuit, and to output a twice inverted waveform signal to the input node of the driver stage; and
at least one further energy storage component arranged to:
store energy within a further energy storage element when the voltage level at the input node of the driver stage comprises the first voltage state; and
use the energy stored within the further energy storage element to generate a decreased voltage level, and to apply the decreased voltage level to the second supply voltage node of the driver stage when the voltage level at the input node of the driver stage comprises the second voltage state.

8. The mixer circuit of claim 7, wherein the switching device is arranged to couple the first supply voltage node to the first voltage supply when the control signal comprises a low voltage level, and to decouple the first supply voltage node from the first voltage supply when the control signal comprises a high voltage level.

9. The mixer circuit of claim 7, wherein the at least one further energy storage component comprises a further switching element operably coupled between the second supply voltage node and a second voltage supply, and controllable via a further control signal to selectively couple the second supply voltage node to the second voltage supply; and the further energy storage element is operably coupled between the second supply voltage node and the further control signal.

10. The mixer circuit of claim 9, wherein the further switching element is arranged to couple the second supply voltage node to the second voltage supply when the further control signal comprises the high voltage level, and to decouple the second supply voltage node from the second voltage supply when the further control signal comprises a low voltage signal.

11. A method of increasing a voltage swing of a local oscillator waveform signal; the method comprising, within a driver stage of a bootstrap circuit:
receiving a waveform signal at an input node of the driver stage;
selectively coupling, via a switching element controllable via a control signal, a first supply voltage node of the driver stage to a first voltage supply;
storing energy within a first energy storage element when a voltage level at the input node comprises a second voltage state, whereby a voltage level at a second supply voltage node drives a voltage level at an output node of the driver stage when the voltage level at the input node comprises the second voltage state; and
using the energy stored within the first energy storage element to generate an increased voltage level, and applying the increased voltage level to a first supply voltage node of the driver stage when the voltage level at the input node of the driver stage comprises a first voltage state, whereby a voltage level at the first supply voltage node drives a voltage level at the output node of the driver stage when a voltage level at the input node comprises a first voltage state;
receiving, at an input of a first inverter circuit, the oscillator waveform signal for which the voltage swing is to be increased;
outputting, as the control signal, an inverted waveform signal;
receiving, at a further inverter circuit, the inverted waveform signal output by the first inverter circuit;
outputting a twice inverted waveform signal to the input node of the driver stage;
wherein the method further comprises:
storing energy within a further energy storage element when a voltage level at the input node comprises the first voltage state, whereby a voltage level at a first supply voltage node drives the voltage level at the output node of the driver stage when the voltage level at the input node comprises the first voltage state; and
using the energy stored within the further energy storage element to generate a decreased voltage level, and applying the decreased voltage level to a second supply voltage node of the driver stage when the voltage level at the input node of the driver stage comprises the second voltage state, whereby a voltage level at the second supply voltage node drives the voltage level at the output node of the driver stage when the voltage level at the input node comprises the second voltage state.

* * * * *